(12) United States Patent
Xu et al.

(10) Patent No.: US 12,365,585 B2
(45) Date of Patent: Jul. 22, 2025

(54) METHOD OF FORMING A MICROSTRUCTURED SURFACE (71) Applicant: THE REGENTS OF THE UNIVERSITY OF CALIFORNIA, Oakland, CA (US)

(72) Inventors: Muchen Xu, Los Angeles, CA (US); Chang-Jin Kim, Beverly Hills, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 18/357,093

(22) Filed: Jul. 21, 2023

(65) Prior Publication Data
US 2024/0018980 A1 Jan. 18, 2024

Related U.S. Application Data (63) Continuation of application No. 15/325,421, filed as application No. PCT/US2015/040777 on Jul. 16, 2015, now abandoned.
(Continued)

(51) Int. Cl.
B81C 99/00 (2010.01)
B63B 1/38 (2006.01)
(Continued)

(52) U.S. Cl.
CPC ............ *B81C 99/0085* (2013.01); *B63B 1/38* (2013.01); *B81B 1/006* (2013.01); *C25B 5/00* (2013.01);
(Continued)

(58) Field of Classification Search
CPC ..... B81B 1/006; B81B 7/007; B81C 99/0085; B41J 2/1601; B41J 2/164; F15D 1/0065;
(Continued)

(56) References Cited

U.S. PATENT DOCUMENTS 3,069,336 A  12/1962 Waite et al.
4,463,063 A   7/1984 Adlhart
(Continued)

FOREIGN PATENT DOCUMENTS

CN   101767629 A   7/2010
CN   107074524 B   8/2017
(Continued)

OTHER PUBLICATIONS

Kolew et al, "Multi-component hot embossing of micro- and nanosystems," 2011 Symposium on Design, Test, Integration & Packaging of MEMS/MOEMS (DTIP), Aix-en-Provence, France, 2011, pp. 284-287. (Year: 2011).*
(Continued)

*Primary Examiner* — A. Dexter Tugbang
(74) *Attorney, Agent, or Firm* — VISTA IP LAW GROUP LLP (57) ABSTRACT A method of forming a microstructured surface includes the operations of depositing electrodes on a surface of a substrate and securing a mold against the surface of the substrate containing the electrodes with a tight contact with the electrodes, the mold containing a plurality of cavities therein. Pressure is applied between the mold and the substrate to force material from the substrate into the plurality of cavities around the electrodes to form a plurality of microfeatures. The mold is separated from the substrate.

13 Claims, 8 Drawing Sheets

Related U.S. Application Data (60) Provisional application No. 62/026,474, filed on Jul. 18, 2014.

(51) Int. Cl.
   *B81B 1/00*   (2006.01)
   *C25B 5/00*   (2006.01)
   *F15D 1/00*   (2006.01)
   *B81B 7/00*   (2006.01)

(52) U.S. Cl.
   CPC ........... *F15D 1/003* (2013.01); *F15D 1/0065* (2013.01); *B63B 2001/387* (2013.01); *B81B 7/0061* (2013.01); *F15D 1/0085* (2013.01)

(58) Field of Classification Search
   CPC ......... F15D 1/003; F15D 1/0085; C25B 5/00; B63B 1/38; B63B 2001/387; H05K 1/0265; B29C 59/022
   See application file for complete search history.

(56) References Cited

U.S. PATENT DOCUMENTS

| | | | |
|---|---|---|---|
| 4,554,222 | A | 11/1985 | Zaromb |
| 7,044,073 | B2 | 5/2006 | Goldstein |
| 7,150,904 | B2 | 12/2006 | D'Urso et al. |
| 7,449,649 | B2 | 11/2008 | Gasparyan et al. |
| 7,459,197 | B2 | 12/2008 | Aizenberg et al. |
| 8,287,808 | B2 | 10/2012 | Krupenkin et al. |
| 8,680,497 | B2 | 3/2014 | Cho et al. |
| 9,314,818 | B2 | 4/2016 | Kim et al. |
| 2006/0029808 | A1 | 2/2006 | Zhai et al. |
| 2006/0055310 | A1 | 3/2006 | Vink et al. |
| 2006/0115623 | A1 | 6/2006 | Aizenberg et al. |
| 2006/0177956 | A1* | 8/2006 | O'Brien ................. B81B 7/007 438/51 |
| 2007/0059213 | A1 | 3/2007 | Aizenberg et al. |
| 2009/0078326 | A1 | 3/2009 | Rosario et al. |
| 2009/0243081 | A1* | 10/2009 | Kapusta ................. B81B 7/007 257/E23.021 |
| 2010/0028604 | A1 | 2/2010 | Bhushan et al. |
| 2010/0166964 | A1 | 7/2010 | Go et al. |
| 2010/0330340 | A1 | 12/2010 | Rothstein et al. |
| 2011/0074742 | A1* | 3/2011 | Chae .................... H05K 1/0265 345/204 |
| 2012/0247383 | A1 | 10/2012 | Wu et al. |
| 2012/0261264 | A1 | 10/2012 | Srinivasan et al. |
| 2013/0122195 | A1 | 5/2013 | Kim et al. |
| 2013/0220813 | A1 | 8/2013 | Anand et al. |
| 2016/0208110 | A1 | 7/2016 | Kim et al. |

FOREIGN PATENT DOCUMENTS

| | | | |
|---|---|---|---|
| DE | 10144259 A1 | 3/2003 | |
| EP | 1959516 A1 | 8/2008 | |
| JP | 09-262563 | 10/1997 | |
| JP | 2006168147 A * | 6/2006 | ............. B81C 99/00 |
| JP | 2011178609 | 9/2011 | |
| JP | 2013-536093 | 9/2013 | |
| WO | WO 2006109583 | 10/2006 | |
| WO | WO 2008/066828 A2 | 6/2008 | |
| WO | WO 2008/0147568 A1 | 12/2008 | |
| WO | WO 2008147568 A1 | 12/2008 | |
| WO | WO 2012/015700 | 2/2012 | |
| WO | WO 2016011271 | 1/2016 | |

OTHER PUBLICATIONS

Response to the extended European search report dated Jul. 9, 2024 for European Patent Application No. 23195269.8, (43 pages).
The extended European search report dated Dec. 13, 2023 for European Patent Application No. 23195269.8, (9 pages).
Choi, Chang-Hwan et al., Large Slip of Aqueous Liquid Flow over a Nanoengineered Superhydrophobic Surface, PRL 96, 066001-1-066001-4 (2006).
Daniello, Robert J. et al., Drag reduction in turbulent flows over superhydrophobic surfaces, Physics of Fluids, vol. 21, 085103, 2009.
Krupenkin, Tom N. et al., Reversible Wetting-Dewetting Transitions on Electrically Tunable Superhydrophobic Nanostructured Surfaces, Langmuir, 2007, 23, 9128-9133.
Lee, Choongyeop et al., Maximizing the Giant Liquid Slip on Superhydrophobic Microstructures by Nanostructuring Their Sidewalls, Langmuir, 25, 12812-12818 (2009).
Lee, Choongyeop et al., Structured Surfaces for a Giant Liquid Slip, PRL 101, 064501-1-064501-4 (2008).
Nosonovsky, Michael et al., Patterned Nonadhesive Surfaces: Superhydrophobicity and Wetting Regime Transitions, Langmuir, vol. 24, pp. 1525-1533, 2008.
Zheng, Q.S. et al., Effects of Hydraulic Pressure on the Stability and Transition of Wetting Modes of Superhydrophobic Surfaces, Langmuir, vol. 21, pp. 12207-12212, 2005.
PCT International Search Report for PCT/US2011/045106, Applicant: The Regents of the University of California, Form PCT/ISA/210 and 220, dated Mar. 28, 2012 (5pages).
PCT Written Opinion of the International Search Authority for PCT/US2011/045106, Applicant: The Regents of the University of California, Form PCT/ISA/237, dated Mar. 28, 2012 (3pages).
Lee, C. et al., Underwater Restoration and Retention of Gases on Superhydrophobic Surfaces for Drag Reduction, PRL, 106, 014502 (2011).
PCT International Preliminary Report on Patentability (Chapter I of the Patent Cooperation Treaty) for PCT/US2011/045106, Applicant: The Regents of the University of California, Form PCT/IB/326 and 373, dated Feb. 7, 2013 (5pages).
Erbil, H. Yildirim et al., Transformation of a Simple Plastic into Superhydrophobic Surface, Science, vol. 299, (2003).
Krupenkin, Tom N. et al., Reversible Wetting-Dewetting Transitions of Electrically Tunable Superhydrophobic Nanostructured Surfaces, Langmuir, 23, 9128-9133 (2007) Supporting Information (pp. 1-7).
Lee, S. et al., Micro-fabricated electrolytic micro-bubblers, Intl, Journal of Multiphase Flow, 31, 706-722 (2005).
Marr, Kevin C., Drag Reduction on a Flat Plate by Trapping Bubbles on the Surface, Thesis, The University of Texas at Austin, (2005) (96pages).
Stephani, Kelly A. et al., An Examination of Trapped Bubbles for Viscous Drag Reduction on Submerged Surfaces, Journal of Fluids Eng., vol. 132, 041303-1-041303-9 (Apr. 2010).
Stephani, Kelly A. et al., Drag Reduction using Trapped Bubbles on a Flat Plate Surface, 3rd AIAA Flow Control Conference, San Francisco, CA (2006), (19pages).
Stephani, Kelly A. et al., The Effects of Trapped Bubbles on Viscous Drag Reduction for Submerged Surfaces, 37th AIAA Fluid Dynamics Conference and Exhibit, Miami, FL (2007) (14pages).
Zhang, Xue Hua et al., Nanobubbles at the Interface between Water and a Hydrophobic Solid, 2008, Langmuir, 24, 4756-4764.
Office Communication from the Chinese Patent Office dated Dec. 1, 2014 issued in Chinese Patent Application No. 2011800466557, Applicant, The Regents of the University of California (8pages) including an English Translations prepared by Kangxin Partners (11pages).
Office Communication from the European Patent Office including extended European Search Report dated Sep. 30, 2014 issued in European Patent Application No. 11812989.9-1703, Applicant: The Regents of the University of California (11pages).
Second Office Action issued by the Chinese Patent Office dated Aug. 12, 2015 in Chinese Patent App No. 201180046655.7 includes English translations (7pages).
Office Action issued by the Japanese Patent Office dated Oct. 6, 2015 in Japanese Patent App No. 2013-521859 includes English translations (19pages).
Definition of Circuit cited in U.S. Appl. No. 13/811,272, dated Nov. 7, 2014 (1page).
Definition of Electrolytic cited in U.S. Appl. No. 13/811,272, dated Nov. 7, 2014 (1page).

(56) References Cited

OTHER PUBLICATIONS

Definition of Immersed cited in U.S. Appl. No. 13/811,272, dated Nov. 7, 2014 (1page).
Decision of Rejection issued by the Japanese Patent Office mailed Mar. 8, 2016 in Japanese Patent App No. 2013-521859 includes English translations (8pages).
PCT International Search Report for PCT/US2015/040777, Applicant: The Regents of the University of California, Form PCT/ISA/210 and 220, dated Oct. 28, 2015 (3pages).
PCT Written Opinion of the International Search Authority for PCT/US2005/040777, Applicant: The Regents of the University of California, Form PCT/ISA/237, dated Oct. 28, 2015 (8pages).
PCT International Preliminary Report on Patentability (Chapter I of the Patent Cooperation Treaty) for PCT/US2015/040777, Applicant: The Regents of the University of California, Form PCT/IB/326 and 373, dated Feb. 2, 2017 (10pages).
Notification of the First Office Action dated Jun. 27, 2018 for Chinese Patent Application No. 2015800498486, Applicant: The Regents of the University of California, (13pages).
The extended European search report dated Mar. 29, 2018 for European Patent Application No. 15822774.4-1010 /3169624, Applicant: The Regents of the University of California, (7pages).
Communication pursuant to Rules 70(2) and 70a(2) EPC dated Apr. 17, 2018 for European Patent Application No. 15822774.4-1010 /3169624, Applicant: The Regents of the University of California, (1page).
First Office dated Jul. 30, 2019 for Japanese Patent Application No. 2017-502709, Applicant: The Regents of the University of California, (8pages).
Notification of the Second Office Action dated Feb. 28, 2019 for Chinese Patent Application No. 2015800498486, Applicant: The Regents of the University of California, (10pages).
Notice of Rejection dated Jan. 28, 2020 in Japanese Patent Application No. 2017-502709, (8 pages).
Response to extended European search report dated Oct. 29, 2018 in European Patent Application No. 15822774.4, (16 pages).
Response to the Second Office Action dated Sep. 4, 2019 in Chinese Patent Application No. 2015800498486, including English translations of pending claims, (6pages).
Notice of Allowance dated Oct. 9, 2019 in Chinese Patent Application No. 2015800498486, (2pages).
McCormick, Michael E. et al., Drag Reduction of a Submersible Hull By Electrolysis, Naval Engineer Journal, Apr. 1973, 11-16.
Lee, Choongyeop et al., Underwater Restoration and Retention of Gases on Superhydrophobic Surfaces for Drag Reduction, PRL 106, 014502 (2011), 15 pages.
Lee, Choongyeop et al., Wetting and Active Dewetting Processes of Hierarchically Constructed Superhydrophobic Surfaces Fully Immersed in Water, Journal of Microelectromechanical Systems, vol. 21, No. 3, Jun. 2012.
Response to the Office Action dated Jul. 17, 2020 for Japanese Patent Application No. 2017-502709, includes English translations of the claims only, (18 pages).
Notice of Allowance dated Aug. 31, 2020 for Japanese Patent Application No. 2017-502709, (4 pages).
Final Office Action dated Oct. 8, 2020 for U.S. Appl. No. 15/325,421, (16 pages).
Examiner's Answer dated May 14, 2021 for U.S. Appl. No. 15/325,421, (9 pages).
Appeal Docketing Notice dated Nov. 3, 2021 for U.S. Appl. No. 15/325,421, (2 pages).
Appeal Decision dated May 30, 2023 for U.S. Appl. No. 15/325,421, (10 pages).
Reply to communication pursuant to Article 94(3) EPC dated Jul. 5, 2021 in European Patent Application No. 15822774.4, (51 pages).
Communication under Rule 71(3) EPC dated Jan. 31, 2023 for European Patent Application No. 15822774.4, (57 pages).
Reply to Communication under Rule 71(3) EPC for European Patent Application No. 15822774.4, (8 pages).

* cited by examiner

FIG. 1
(PRIOR ART)

Wires

FIG. 3A

Mesh

Dewetted
FIG. 8A

Partially wetted
FIG. 8B

De-wetting
FIG. 8C

Dewetted
FIG. 8D

METHOD OF FORMING A MICROSTRUCTURED SURFACE

RELATED APPLICATIONS

This Application is a divisional of U.S. application Ser. No. 15/325,421, filed Jan. 10, 2017, which is a U.S. National Stage filing under 35 U.S.C. § 371 of International Application No. PCT/US2015/040777, filed Jul. 16, 2015, which claims priority to U.S. Provisional Patent Application Nos. 62/026,474, filed Jul. 18, 2014. Priority is claimed pursuant to 35 U.S.C. § 119 and any other applicable statute. The above-noted Patent Applications are incorporated by reference as if set forth fully herein.

TECHNICAL FIELD

The field of the invention generally relates to methods and devices that use microstructured hydrophobic surfaces including superhydrophobic surfaces and more particularly to methods and devices that maintain gas on the microstructured hydrophobic surfaces while they are submerged in liquid.

BACKGROUND

By today's convention, a superhydrophobic (SHPo) surface is defined as a solid surface on which water in air forms a contact angle greater than 150 degrees. Such high contact angles have so far been found only on structured hydrophobic surfaces, the structures typically in micrometers, although not all structured hydrophobic surfaces are SHPo. A typical demonstration of SHPo surfaces is water droplets rolling around on them with little resistance. Recently, SHPo surfaces have shown promise when submerged in water (i.e., no droplet) as well because their surface structures or microfeatures can hold a gas film under water. One compelling application is drag reduction, as the gas held within (in between) the microfeatures lubricates water flows on them, effectively allowing the water to slip on the surface. How slippery a liquid flows on a solid surface is quantitatively defined as slip length, which had never been found to be more than 1 micrometer (too small to be useful for drag reduction) until the advent of SHPo surfaces. Some SHPo surfaces have demonstrated effective slip lengths in hundreds of micrometers, which are large enough to benefit even regular (i.e., large) fluidic systems. Drag reduction for turbulent flows has also been reported. For drag reduction, SHPo surfaces are considered a superior alternative to the existing bubble injection method because the stable gas upon the surfaces makes the SHPo method passive (i.e., energy efficient) and simple (i.e., easy to implement). Moreover, it has been shown that the minimized solid-liquid contact on SHPo surfaces can resist surface fouling, especially biofouling. Despite its great potential, drag reduction by SHPo surfaces has been considered strictly limited to laboratory conditions because until recently there was no indication that such SHPo surfaces could retain the gas layer long enough under real conditions.

Figure 1:
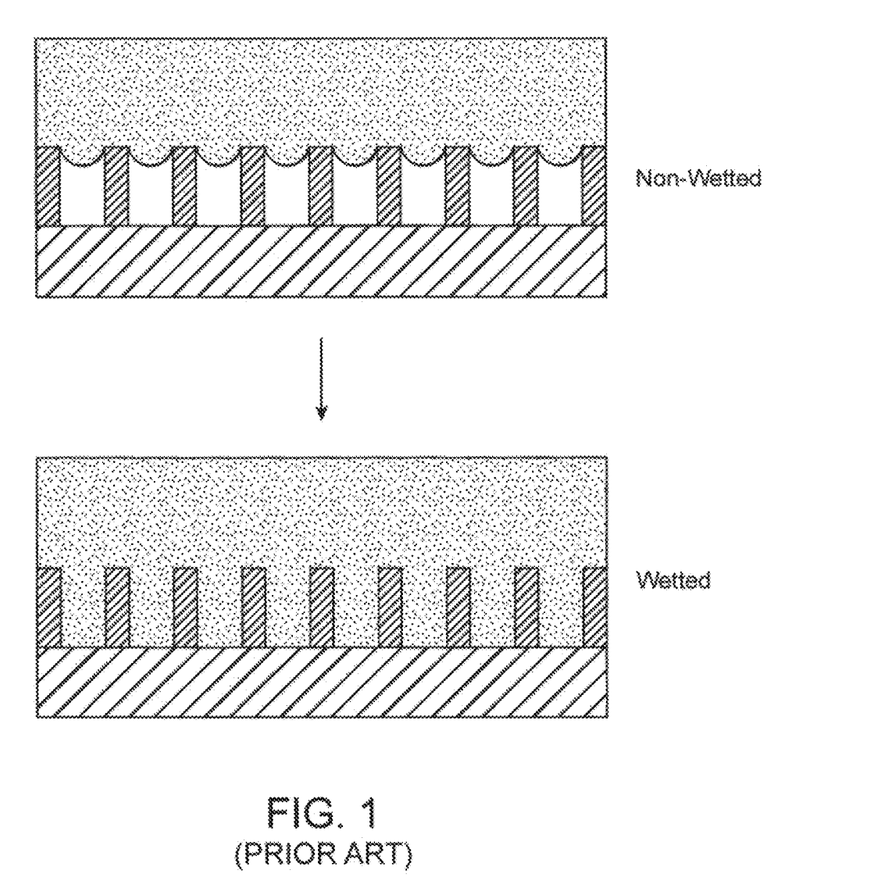
FIG. 1 illustrates a SHPo surface according to the prior art.

Considering structured hydrophobic surfaces that meet the definition of SHPo surface as a typical example, SHPo surfaces are not SHPo anymore once they lost the trapped gas and become wetted (i.e., the liquid enters in between the microfeatures). Because the wetting transition of a SHPo surface inside a liquid tends to be spontaneous, a liquid impregnation, incited by various instigators, has an irrevocable effect against drag reduction. FIG. 1, for example, illustrates the transition of a SHPo surface from a non-wetted state (top) to a wetted state (bottom). For example, the surface may get wet and lose its slip effect if it has defects, the liquid is under pressure, or the gas within the microfeatures diffuses away to the liquid over time. Once the SHPo surface has become wetted as illustrated in FIG. 1, the superhydrophobicity and its attendant benefits in drag reduction, biofouling prevention, etc. are lost.

Recently, several approaches have been suggested to increase the stability of the gas layer on a structured hydrophobic (e.g., SHPo) surface submerged in liquid against its pressure (i.e., hydrostatic pressure if the liquid is water). For example, a gas layer can be pneumatically pressurized either actively or passively so that it can withstand elevated liquid pressures. Alternatively, hierarchically structures have been employed to make SHPo surfaces more resistant to liquid pressure. However, these previous improvements do not work unless the liquid pressure is relatively small (e.g., even 0.5 atm is too high). Moreover, these approaches are only preventive measures. They are ineffective once the gas layer is disrupted. The ability to maintain the gas on the structured hydrophobic surfaces under various adverse conditions is needed to utilize the gas trapping surfaces in most real applications. More desirable for robustness is the ability to restore the gas even after the surface becomes wetted by any unexpected events. A successful scheme should be able to displace the liquid that has impregnated the surface structures with new gas and restore a stable gas film.

U.S. Patent Application Publication No. 2013/0122195 describes a method and device for restoring and maintaining superhydrophobicity in a self-regulating manner. Here, self-regulation means the restoration and maintenance are accomplished without any discrete sensing or control mechanism. More specifically, the gas is replenished only when and where the existing gas is lost without employing any sensing mechanism to detect the loss of the existing gas or control mechanism to decide to provide new gas.

In one scheme for the self-regulated gas replenishment of the above-noted '195 publication, the replenishing gas is generated from the electrolysis of the intruding water. Since this gas generation is electrolytic, i.e., electrochemical driven by electric power, the superhydrophobic surface is electrically connected to an external power source that provides the necessary energy. To make self-regulated restoration and maintenance of superhydrophobicity more practical for implementation, however, it is highly desirable that the gas-recovering surface does not require any external assistance such as the external power source. That is to say, there is a need to provide for a surface that can maintain and restore superhydrophobicity in a "self-sufficient" manner, i.e., without the need for any external assistance, as well as the self-regulating manner.

In another scheme for the self-regulated gas replenishment of the '195 publication, the replenishing gas is generated from the chemical reactor by chemical means, which would not need energy input from outside. While self-sufficient as well as self-regulated, the chemical gas generation was found to be inefficient and offer only a short lifetime of service. For example, in this method, there is residual electrolyte (e.g., moisture) that is left on the reactive surface which can cause the gas generation to continue even beyond the time required to restore the surface to a de-wetted state. Because of this, the chemical reaction-based gas generation surface of the type disclosed in the '195 publication suffers from a short lifespan. A self-controlled, self-sufficient gas maintenance method with a longer service life is desired.

SUMMARY

In one embodiment, a microstructured surface is disclosed with non-wetting (i.e., hydrophobic if used with or in water) microfeatures or other structures that has a self-regulated, self-powered gas generator, which generates a gas or gases through electrochemical reaction. The microfeatures may include, by way of example, trenches, ridges, posts, holes, random structures, or the like. Self-regulation refers to a gas or gases that is generated within the microfeatures when all or a portion of the microfeatures are filled with an electrolyte (i.e., electrically conductive liquid, e.g., seawater) and not generated when the microfeatures are free of the electrolyte, all without any other component to sense the loss of gas or decide the time for gas generation. Self-power refers to gas that is generated by a powering mechanism or feature built within the surface without using any external assistance such as an external source of electric power. Since electrochemical processes require electric energy, the disclosed device needs to be self-powered so as not to require an external power source such as battery. The self-powered gas generation is a subset of self-sufficient gas-generation modalities or designs that do not require external assistance. For example, gas generation by a chemical process is self-sufficient but not self-powered. This difference is important because the gas generator based on electrochemical processes has a much longer lifespan compared with the gas generator based on chemical process.

The invention helps to maintain the gas on a gas-retaining microstructured surface (e.g., superhydrophobic surface) when submerged in a liquid. Examples of utility include (1) reducing the skin-friction drag of a solid object moving in a liquid (e.g., water vehicle or watercraft), (2) a liquid flowing past a solid surface (e.g., pipe flow), and (3) a surface that does not suffer or suffers less from biofouling under water.

In one embodiment, a microstructured surface includes a plurality of microfeatures disposed on a substrate and defining a space located between inner surfaces of the plurality of microfeatures, wherein the inner surfaces between the plurality of microfeatures are hydrophobic. The microstructured surface includes a gas generator formed from a first electrode of an electrode pair that is electrically connected to a second electrode of the electrode pair, the first electrode disposed within the space located between inner surfaces of the plurality of microfeatures and configured to generate a gas by a spontaneous electrochemical reaction when part of the space located between the microfeatures is filled with an electrolyte solution while the microstructured surface is submerged in the electrolyte solution. Gas generation of this spontaneous electrochemical reaction is part of a galvanic reaction unlike the usual electrolytic reaction that would require the presence of an external power source. Although spontaneous instead of electrolytic, the galvanic process is still electrochemical, so that the reaction is turned on and off by the electrical state of the system. For example, when the generated gas separates the electrolyte from the electrode surface, the electric circuit is opened and the electrochemical reaction stops. The same cannot be said for chemical reactions. Even after the generated gas separates the electrolyte from the reactive surface, the residual liquid (e.g., moisture) on the surface would prolong the chemical reaction for some period of time. The prolonged reaction compromises the self-regulated nature of the gas generation and reduces the lifespan of the device.

In another embodiment, a microstructured surface includes a plurality of microfeatures disposed on a substrate and defining a space located between inner surfaces of the plurality of microfeatures, wherein the inner surfaces between the plurality of microfeatures are hydrophobic. The microstructured surface includes a gas generator formed from a first electrode and a second electrode of an electrode pair electrically connected to one another, the first electrode and the second electrode disposed within the space located between inner surfaces of the plurality of microfeatures and configured to generate a gas in between the microfeatures by spontaneous electrochemical reaction when part of the space is filled with an electrolyte solution while the microstructured surface is submerged in the electrolyte solution.

In another embodiment, a method of forming a microstructured surface includes depositing electrodes on a surface of a substrate; securing a mold against the surface of the substrate containing the electrodes, the mold containing a plurality of cavities therein; applying pressure between the mold and the substrate to force material from the substrate into the plurality of cavities to form a plurality of microfeatures; and separating the mold from the substrate.

Other objects, features and advantages of the present invention will become apparent to those skilled in the art from the following detailed description. It is to be understood, however, that the detailed description and specific examples, while indicating some embodiments of the present invention are given by way of illustration and not limitation. Many changes and modifications within the scope of the present invention may be made without departing from the spirit thereof, and the invention includes all such modifications. Moreover aspects of one embodiment may be utilized in other, different embodiments.

BRIEF DESCRIPTION OF THE DRAWINGS

FIG. 1 illustrates the transition of a SHPo surface from a non-wetted state (top) to a wetted state (bottom).

FIGS. 2A-2C illustrates one embodiment of a microstructured surface wherein one electrode of an electrode pair is disposed within the space located between adjacent microfeatures. A cross-sectional view taken along the line A-A of FIG. 3A is shown.

FIGS. 3A and 3B illustrate two different electrode configurations of the embodiment of FIG. 2.

FIGS. 4A-4C illustrates another embodiment of a microstructured surface wherein an electrode pair is disposed within the space located between adjacent microfeatures. A cross-sectional view taken along the line A-A of FIG. 5A is shown.

FIGS. 5A and 5B illustrate two different electrode configurations of the embodiment of FIG. 4.

FIGS. 8A-8D illustrate a panel of photographs of a microstructured hydrophobic device illustrating operation of one embodiment. The vertical black lines are the electrodes. Horizontal black lines are the gas that is formed in the spaces between microfeatures (which appear clear, i.e., the black lines disappear where they are wetted).

DETAILED DESCRIPTION OF THE ILLUSTRATED EMBODIMENTS

Figure 2A:
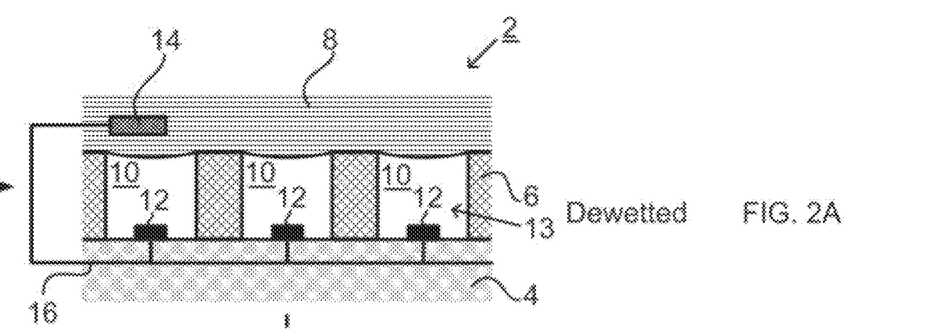
FIG. 2A illustrates the microstructured surface in a dewetted state.
Figure 2B:
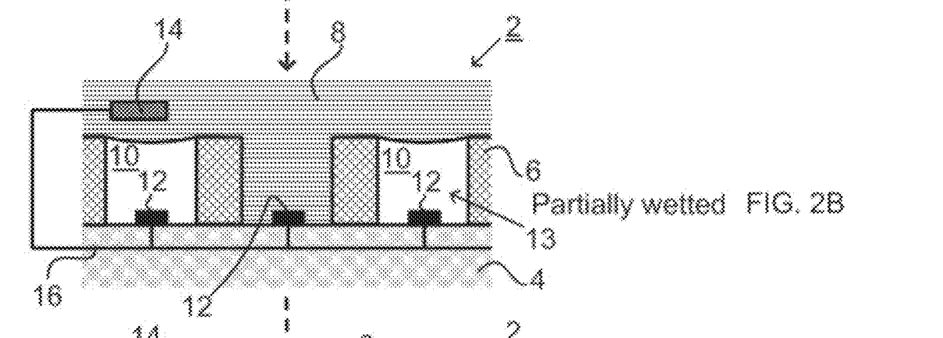
FIG. 2B illustrates the microstructured surface in a partially wetted state (e.g., one of the spaces between adjacent microstructures is filled with electrolyte).
Figure 2C:
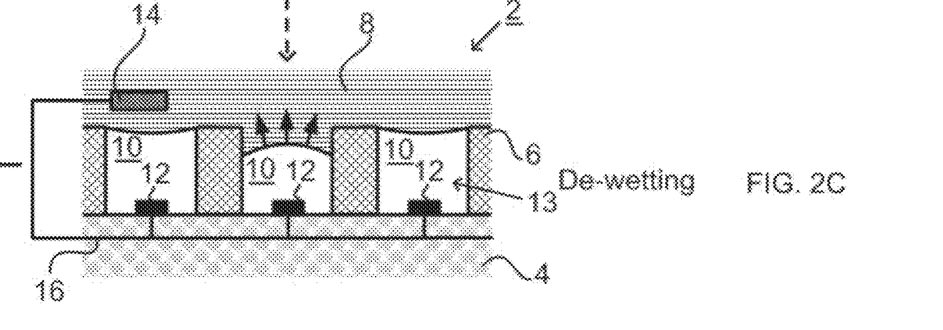
FIG. 2C illustrates the microstructured surface in a de-wetting state wherein gas that is generated at the one electrode pushes the electrolyte fluid out of the space as indicated by the arrows.

FIG. 2 illustrates a microstructured hydrophobic surface 2 according to one embodiment. The microstructured surface 2 includes a substrate 4 having a plurality of microstructures or microfeatures 6 disposed thereon. The microfeatures 6 are generally oriented substantially orthogonal to the substrate 4. The use of the term "microfeatures 6" means, when used herein, microscopic physical features; they are commonly in micrometer scale but can be in smaller or larger scale. The microfeatures 6 may be arranged in an array or random configuration. Microfeatures 6 can include gratings, trenches, ridges, posts, pillars, holes, random structures, or porous materials. The substrate 4 may be formed from any number of materials but, as explained in the method, may include a polymer if molding techniques are used to form the microstructured surface 2. The microfeatures 6 have a height in which they project relative to a surface of the substrate 4. The height may vary but typically is tens of microns (e.g., height=50 μm) for drag-reduction applications and may be reduced to the single micron range (e.g., height=5 μm) for anti-fouling applications. The microfeatures 6 are separated from one another by a distance. The pitch is center-center distance between the nearest neighboring microfeature 6. A liquid solution containing electrolyte 8 is disposed on the microstructured surface 2. When the space between neighboring microfeatures 4 is filled with a gas 10, a meniscus is formed that may sag or bulge depending on the pressure difference between the liquid and the gas.

The height of the microfeatures 6 should be high enough such that the sagging meniscus does not touch the substrate 4. This height is also a function of the pitch of the microfeatures 6. It should be understood that a microstructured surface 2 includes a surface that contains microfeatures 6 made of or whose surface is made of a material that water or liquid of interest does not wet, i.e., forms a contact angle larger than 90° on its surface. This means the liquid is not restricted to water and may be of any kind, including water, oil, or solvent, despite the use of "hydrophobic" as described herein.

The microfeatures 6 may be formed from the same or different material from the substrate 4. For instance, in some embodiments, the microfeatures 6 may be formed from a polytetrafluoroethylene (PTFE) or the like. The microfeatures 6 may be made mostly from a material that is particularly hydrophobic. Alternatively, at least some portions of the microfeatures 6 may be coated with a hydrophobic material such as PTFE or the like. In some embodiments, the top surfaces of the microfeatures 6 may not be hydrophobic so that only the inner surfaces between the microfeatures 6 are hydrophobic. During typical applications, a fluid of electrolyte 8 that is electrically conductive is disposed on the microstructured surface 2. A typical electrolyte 8 may include seawater or water having dissolved ionic species therein.

With reference to FIG. 2, the microstructured surface 2 includes a first electrode 12 and a second electrode 14 that are in electrical communication with one another, for example, connected to one another via a conductor 16. Conductor 16 may be a wire, electrical line, trace, tracks, vias, or the like. The first electrode 12 and the second electrode 14 together makes a "built-in" or "self-powered" gas generator that is configured to generate a gas 10 in between the microfeatures 6. Importantly, the gas 10 is generated on the electrode 12 without the aid of any applied power source. Instead, the first electrode 12, the second electrode 14, and the electrolyte 8 are made from materials having distinctly different standard electrode potentials (SEP) (or standard reduction potentials) so that when electrolyte 8 fills the space between microfeatures 6 the two electrodes 12, 14 and the electrolyte 8 form an electrochemical cell (or more specifically a galvanic cell) that spontaneously generates a gas on electrode 12. For the spontaneous reaction to occur, the overall potential of the galvanic cell should overcome the overpotential needed for gas generation on the first electrode 12. The overpotential is the potential difference (i.e., voltage) between a half-reaction's thermodynamically determined reduction potential and the potential at which the redox (reduction/oxidation) event is observed experimentally. For example, bubble formation of gas 10 causes overpotential. Also, the magnitude of overpotential needed for gas generation on the first electrode 12 should be smaller than that on the second electrode 14, so that gas is generated on electrode 12 rather than on electrode 14. Any electrolytes 8 that would generate gas in half-reaction could be used here.

The following criteria set forth the conditions required for the operation of the microstructured surface 2 submerged in electrolyte 8 having a first electrode 12 used for gas generation that is located in the space 13 between microfeatures 6 and a second electrode 14 that may or may not be located in the space 13 as explained herein. Gas generation does not appreciably occur at the second electrode 14 but rather occurs at the first electrode 12 in this description. For the first condition, the SEP of the second electrode 14, denoted $SEP_2$, should be different from the SEP of electrolyte 8, denoted $SEP_3$ as seen in Equation 1 below:

$$SEP_2 \neq SEP_3 \qquad \text{Eq. 1}$$

This condition (Equation 1) is required to ensure that there is a reaction between the second electrode 14 and the electrolyte 8.

The second condition is that the half-reaction of electrolyte 8 should produce gas under standard pressure and temperature. This condition is to ensure that the reaction will generate gas.

The third condition is that the difference in the theoretical standard cell potentials between the second electrode 14 and electrolyte 8 ($SEP_2$–$SEP_3$) should be, in magnitude, larger than the overpotential of half-reaction of electrolyte 8 on the first electrode 12, denoted $OP_{3/1}$ as seen in Equation 2 below:

$$|SEP_2\ SEP_3|>|OP_{3/1}| \qquad \text{Eq. 2}$$

This condition (Equation 2) is to ensure that gas 10 can be generated on the first electrode 12.

For the fourth condition, the overpotential of half-reaction of electrolyte 8 on the first electrode 12, denoted $OP_{3/1}$, should be, in magnitude, smaller than the overpotential of half-reaction of electrolyte 8 on the second electrode 14, denoted $OP_{3/2}$ as seen in Equation 3 below:

$$|OP_{3/1}|<|OP_{3/2}| \qquad \text{Eq. 3}$$

This condition (Equation 3) is to ensure the gas 10 is generated mainly on the first electrode 12 rather than on the second electrode 14. All four conditions should be satisfied for the gas generation to operate properly.

Note that the above conditions can be divided into two scenarios, depending on whether the gas generation is by reduction or oxidation reaction. If the gas generation on the first electrode 12 is by reduction reaction (e.g., $2H^+ + 2e^- \rightarrow H_2$), then the SEP of the second electrode 14, $SEP_2$, should be smaller than the SEP of the electrolyte, $SEP_3$ as seen by Equation 4 below.

$$SEP_2<SEP_3 \qquad \text{Eq. 4}$$

In addition, the half-reaction of the electrolyte 8 should produce the gas under standard pressure and temperature.

Further, the theoretical standard electrode potential between the second electrode 14 and the electrolyte 8 ($SEP_2$–$SEP_3$) should be smaller (i.e., more negative) than the overpotential of half-reaction of the electrolyte 8 on the first electrode 12, $OP_{3/1}$ as seen by Equation 5 below.

$$SEP_2-SEP_3<OP_{3/1} \qquad \text{Eq. 5}$$

The overpotential of half-reaction of the electrolyte 8 on the first electrode 12, $OP_{3/1}$, should be larger (i.e., less negative) than the overpotential of half-reaction of the electrolyte 8 on the second electrode 14 $OP_{3/2}$ as seen by Equation 6 below.

$$OP_{3/1}>OP_{3/2} \qquad \text{Eq. 6}$$

Alternatively, if the gas generation on the first electrode 12 is by oxidation reaction (e.g., $4OH^- + 4e^- \rightarrow O_2 + 2H_2O$), the SEP of the second electrode 14 $SEP_2$ should be larger than the SEP of the electrolyte 8 $SEP_3$ as seen by Equation 7 below.

$$SEP_2>SEP_3 \qquad \text{Eq.7}$$

The half-reaction of the electrolyte 8 should produce a gas under standard pressure and temperature. The theoretical standard electrode potential electrode potential between the second electrode 14 and the electrolyte 8 ($SEP_2$–$SEP_3$) should be larger (i.e., more positive) than the overpotential of half-reaction of the electrolyte 8 on the first electrode 12, $OP_{3/1}$ as seen by Equation 8 below.

$$SEP_2-SEP_3>OP_{3/1} \qquad \text{Eq. 8}$$

The overpotential of half-reaction of the electrolyte 8 on the first electrode 12, $OP_{3/1}$, should be smaller (i.e., less positive) than the overpotential of half-reaction of the electrolyte 8 on the second electrode 14 $OP_{3/2}$ as seen by Equation 9 below.

$$OP_{3/1}<OP_{3/2} \qquad \text{Eq. 9}$$

Specifically, according to one embodiment, if the electrolyte 8 is a neutral or alkaline water solution (e.g., seawater), the standard electrode potential is about −0.83 V from $2H_2O + 2e^- \leftrightarrow H_2(g) + 2OH^-$. If the electrolyte 8 is an acid water solution, the standard electrode potential is 0 V from $2H^+ + 2e^- \leftrightarrow H_2$ (g). Once the electrolyte 8 is chosen, possible materials combinations for the first electrode 12 and the second electrode 14 could be obtained, satisfying the constraints stated above regarding standard electrode potential and over-potential. For a specific example, the first electrode 12 may be made from a metal or metal alloy containing nickel, the second electrode 14 may be made from a metal or metal alloy containing magnesium, and the electrolyte 8 may be seawater (although other electrolytes may also be used such as fresh water, acid solutions, basic solutions, and the like). In this case, the gas 10 that is produced is hydrogen at the first electrode 12. Table 1 below lists various materials and SEP and overpotential values that have been tested with successful results.

TABLE 1

| Name | Material | Half reaction | SEP | \|OP\|<br>($H_2$ evolution at 25° C.) |
|---|---|---|---|---|
| First Electrode | Nickel | N/A (inert) | N/A | 0.28 V |
| Second Electrode | Magnesium | $Mg^{2+}(aq) + 2e^- \leftrightarrow Mg(s)$ | −2.372 V | ~1 V |
| Electrolyte | Seawater | $2H_2O(l) + 2e^- \leftrightarrow H_2(g) + 2OH^-$ (aq) | −0.8277 V | N/A |

Where and when at least a portion of the space between microfeatures 6 are filled with the electrolyte 8 and contact the gas generating electrode, gas 10 (e.g., hydrogen) is automatically generated by the spontaneous electrochemical reaction (i.e., galvanic reaction) that takes place. The microfeatures 6 are designed and spaced such that the gas 10 that is generated on the electrode 12 is trapped and grows within the localized space, gap, or well 13 formed between adjacent microfeatures 6. Once the volume of generated gas 10 has grown in size to the top (e.g., upper surface) of the microfeatures 6 the gas 10 proceeds to extend laterally in between the microfeatures 6 across the microstructured surface 2. In this regard, the microstructured surface 2 can be restored from a partially or fully wetted state back into a non-wetted state. In one embodiment, the first electrode 12 is disposed on or embedded in the substrate 4. FIGS. 2A-2C illustrates the first electrode 12 located on the substrate 4 within the space 13 formed between adjacent microfeatures 6. In this embodiment, the first electrode 12 is located on a bottom surface of space or gap 13 located between the microfeatures 6. Alternatively, the first electrode 12 may be located on the sidewall surface of the microfeatures 6. Thus, the first electrode 12 can be located in any location between the microfeatures 6, wherein between microfeatures 6 refers to the spaces 13 and inner surfaces between microfeatures 6 (excluding the top or exposed surfaces of the microfeatures 6). Note that in the embodiment of FIGS. 2A-2C, the second electrode 14 is not located between the microfeatures 6. Instead, the second electrode 14 is located outside of the internal space 13 created by the microfeatures 6.

The gas 10 that is generated by the first electrode 12 is trapped and grows in the localized space or well 13 formed between adjacent microfeatures 6. It should be noted that gas generation is self-regulated in this embodiment. In particular, the electrochemical circuit is "closed" and gas generation occurs only if the microstructured surface 2 becomes partially or fully wetted. Once the electrolyte 8 invades the space 13 between adjacent microfeatures 6 the circuit is closed between the first electrode 12 and the second electrode 14 and the electrochemical reaction proceeds, thereby liberating gas 10 within the spaces 13 located between the microfeatures 6. After sufficient gas generation, the electrochemical circuit then becomes "open" and the electrochemical reaction stops. This feature is particularly advantageous because there is no need for any sensing and controlling circuitry to switch the gas generator (i.e., electrode) on or off; in other words, the gas generation is self-regulated to respond to presence of electrolyte 8 in between the microfeatures 6.

The gas generation occurs spontaneously without connecting the microstructured surface 2 to any external power source (e.g., battery); in other words, the gas generation is self-sufficient. However, since the gas generation is the product of an electrochemical reaction (i.e., powered electrically albeit using internal energy) rather than pure chemical reaction (i.e., no electric power involved), one may call the disclosed method of gas generation not only self-sufficient but also "self-powered." In addition and related to the above difference, it is worth noting that the gas generator (i.e., electrode) located in between the microfeatures 6 is not a reactant in the current self-powered, electrochemical reaction. Self-powering and self-regulating the gas generation, the microstructured surface 2 has the built-in ability to maintain the gas 10 trapped in between its microfeatures 6.

Figure 3A:
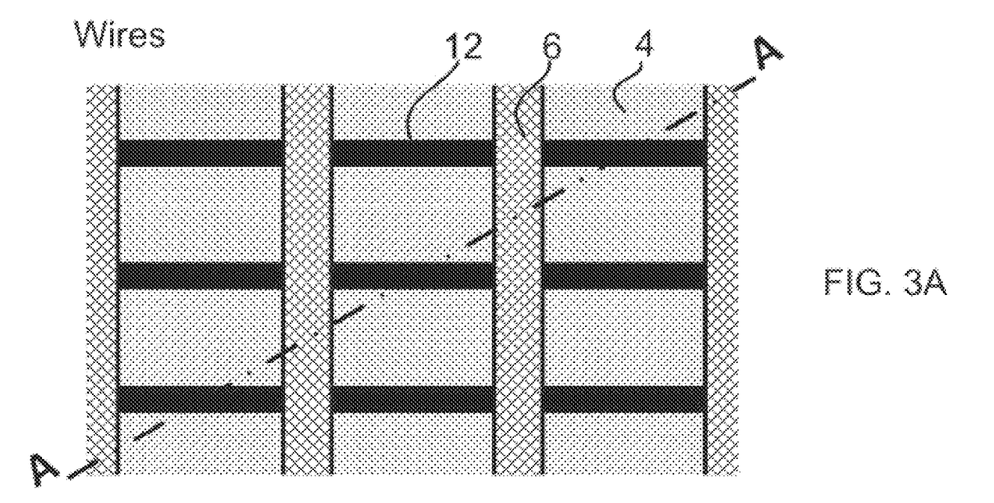
FIG. 3A illustrates a wire pattern embodiment.
Figure 3B:
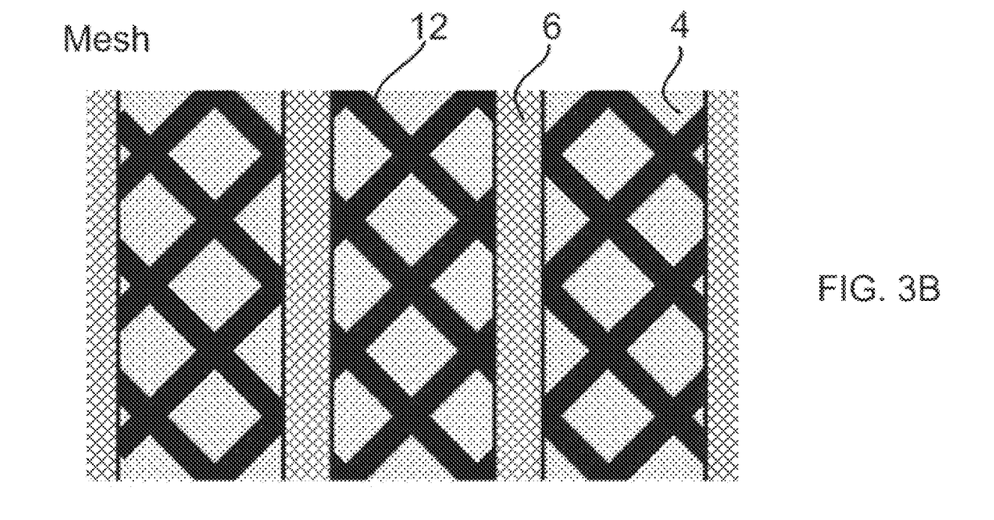
FIG. 3B illustrates a mesh pattern embodiment.

FIG. 3A illustrates a top view of one configuration of a microstructured surface 2. The view of FIGS. 2A, 2B, and 2C is taken along the cross-sectional line A-A in FIG. 3A. In this embodiment, the first electrodes 12 are formed as a pattern of substantially parallel wires located between and under the microfeatures 6. The microfeatures 6 are formed as a grating or the like that extend across the surface of the substrate 4. The first electrode wires 12 run along or across the spaces 13 formed between adjacent microfeatures 6. FIG. 3B illustrates a top view of another configuration of a microstructured surface 2. In this embodiment, the first electrodes 12 are formed as a mesh pattern that is located between and under the microfeatures 6.

Figure 4A:
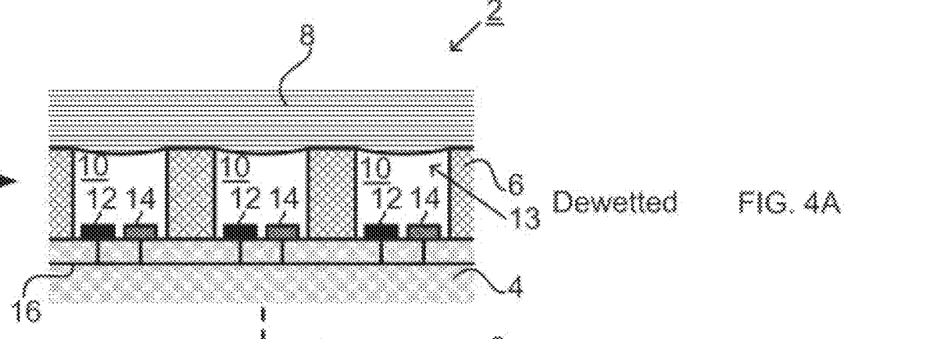
FIG. 4A illustrates the microstructured surface in a dewetted state.
Figure 4B:
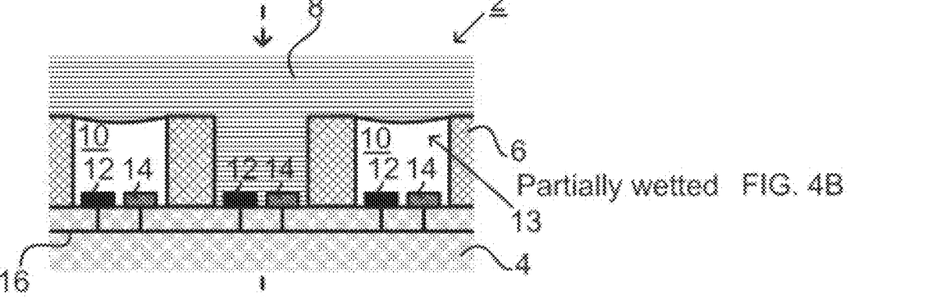
FIG. 4B illustrates the microstructured surface in a partially wetted state (e.g., one of the spaces between adjacent microstructures is filled with electrolyte).
Figure 4C:
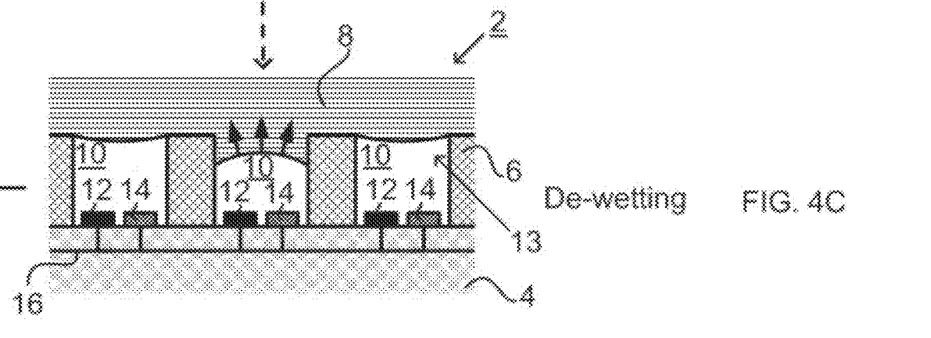
FIG. 4C illustrates the microstructured surface in a de-wetting state wherein gas that is generated at the electrode pair pushes the electrolyte fluid out of the space as indicated by the arrows.

FIGS. 4A-4C illustrates another embodiment of a microstructured surface 2. In this embodiment, both the first electrode 12 and the second electrode 14 are placed in the space 13 formed between the microfeatures 6. Again, the first electrode 12 and the second electrode 14 are electrically connected directly or via a conductor 16. The first electrode 12, the second electrode 14, and the electrolyte 8 are made from materials having distinctly different standard electrode potentials so that when electrolyte 8 fills the spaces 13 of the microfeatures 6 the two electrodes 12, 14 and the electrolyte 8 form an electrochemical cell (more specifically, a galvanic cell) that spontaneously generates a gas 10 on the first electrode 12. For the spontaneous reaction to occur, the overall potential of the galvanic cell should overcome the overpotential needed for gas generation on the first electrode 12. Also, the magnitude of overpotential needed for gas generation on the first electrode 12 should be lower than that on the second electrode 14 so that gas is generated on electrode 12 rather than on electrode 14. Any electrolytes 8 that would generate gas in half-reaction could be used here. The same criteria of four conditions described above apply to this embodiment as well.

Figure 5A:
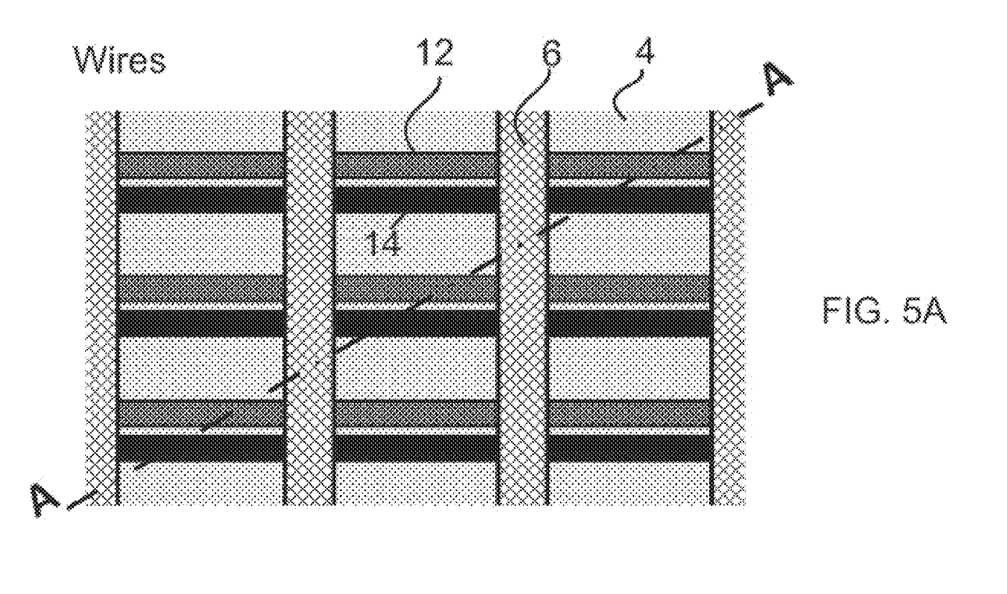
FIG. 5A illustrates a wire pattern embodiment.
Figure 5B:
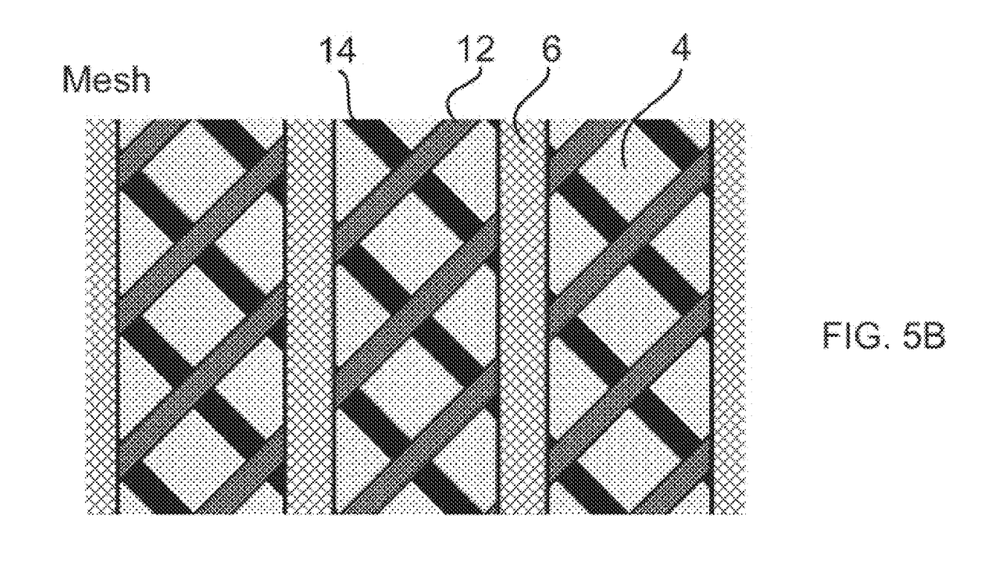
FIG. 5B illustrates a mesh pattern embodiment.

FIG. 5A illustrates a top view of one configuration of a microstructured surface 2 of the embodiment of FIG. 4. The view of FIGS. 2A, 2B, and 2C is taken along the cross-sectional line A-A in FIG. 3A. In this embodiment, one or both of the first electrodes 12 and the second electrodes 14 are formed as a pattern of substantially parallel wires between and under the microfeatures 6. FIG. 5B illustrates a top view of another configuration of a microstructured surface 2. In this embodiment, one or both of the first electrodes 12 and the second electrodes 14 are formed as a mesh pattern between and under the microfeatures 6. Again, while FIG. 4 illustrates the first electrode 12 and the second electrode 14 being located at the bottom surface of the substrate 4 between the microfeatures 6, one or both of the electrodes 12, 14, may be located on the sidewall surfaces of the microfeatures 6.

Figure 6A:
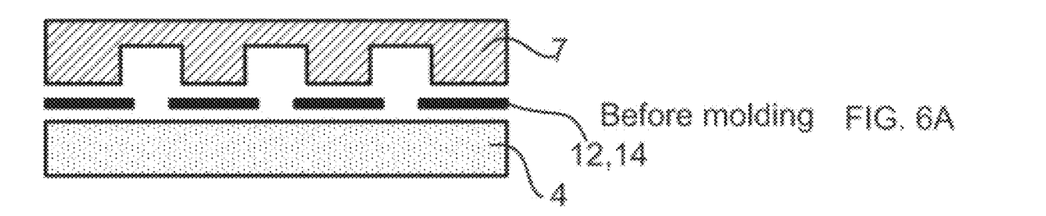
FIGS. 6A-6E illustrates a method of fabricating a microstructured hydrophobic surface according to one embodiment.
Figure 6B:
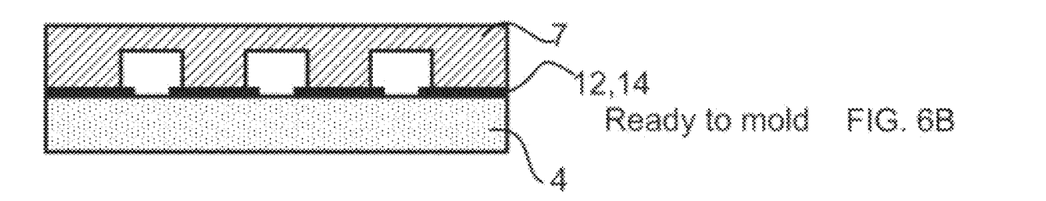
Figure 6C:
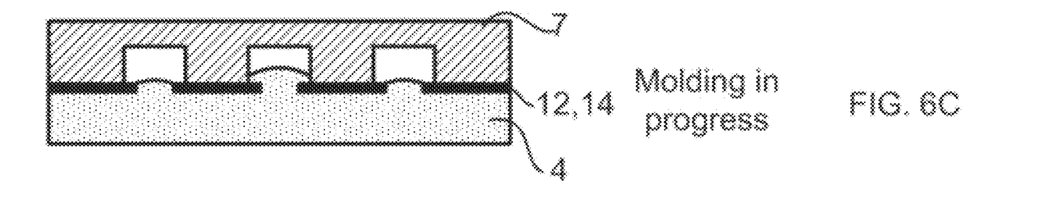
Figure 6D:
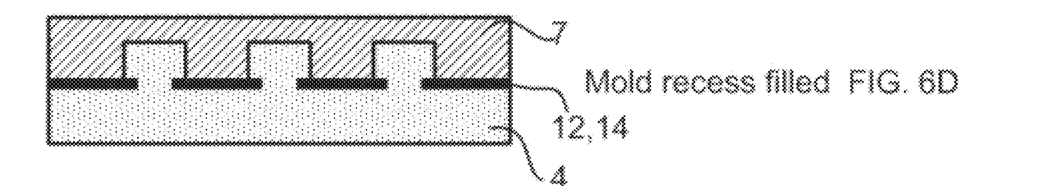
Figure 6E:
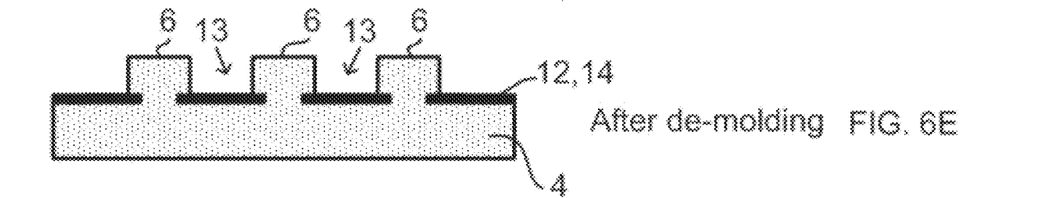

FIG. 6A-6E illustrates a process of fabricating a microstructured surface 2 according to one embodiment. This process relies on a molding technique such as embossing or imprinting. First, the first electrode 12 or first and second electrodes 12, 14 are placed between substrate 4 and mold 7 as seen in FIGS. 6A, 6B. The electrodes 12, 14 may be a porous layer, a mesh, or a collection of wires, among others. The feature size (e.g., width of the wires) of the electrodes 12, 14 should be smaller than the openings (e.g., cavity diameter, trench width) on the mold 7 so that the electrodes 12, 14 do not substantially block the recesses. The substantial coverage of the recess openings would hinder the filling of the recesses during the molding step shown in FIG. 6C. During the molding step of FIG. 6C, under applied pressure and optionally at an elevated temperature as well, the material or its top portion of substrate 4 flows around (or through the openings of) the electrodes 12, 14 and fill into the recesses on mold 7. After the mold 7 is full as shown in FIG. 6D, mold 7 is separated from substrate 4, as shown in FIG. 6E. At this point, the electrodes 12, 14 may be completely exposed or covered with a thin residual layer of the material from substrate 4. This thin residual material may be removed by one of many etching methods known to those skilled in the art, such as plasma etching, chemical etching, or the like if necessary. The device may function as intended even with the electrodes 12, 14 not fully exposed, as electrochemical gas generation can still occur if the residual layer is thin enough. The substrate 4 may be thick, thin, rigid, or flexible, and may be made of one material or multiple layers of different materials. The material of microfeatures 6 may be the same as or different from the material of substrate 4, although FIGS. 6A-6E illustrates the same material being used for the substrate 4 and microfeatures 6.

An important aspect for the disclosed fabrication method is how to realize the electrodes (e.g., electrodes 12, 14) exposed or almost exposed in between microfeatures 6 while forming microfeatures 6 by embossing/imprinting. As shown in FIGS. 6C and 6D, the electrodes are in a tight contact with mold 7 during the molding step. This tight contact can prevent the substrate 4 material from seeping onto the electrode surfaces, while flowing into the recesses or cavities of mold 7. After de-molding, the electrode surfaces that were in tight contact with mold 7 are exposed in between microfeatures 6 with no or little residual material on top, as shown in FIG. 6E. Usually, embossing/imprinting microfeatures 6 with functional materials in between the microfeatures 6 would require separate fabrication steps of molding the microfeatures 6 and placing the functional materials in between the molded microfeatures 6. The current invention completes the process with only a single or nearly single molding step and still does not leave much residual material on the functional materials, keeping the simplicity of traditional embossing/imprinting techniques while obtaining the functional materials exposed in between the microfeatures 6. Although developed for the gas-retaining device above, this processing method is useful for other purposes as well, such as microfluidic devices for biochemical applications.

Figure 7:
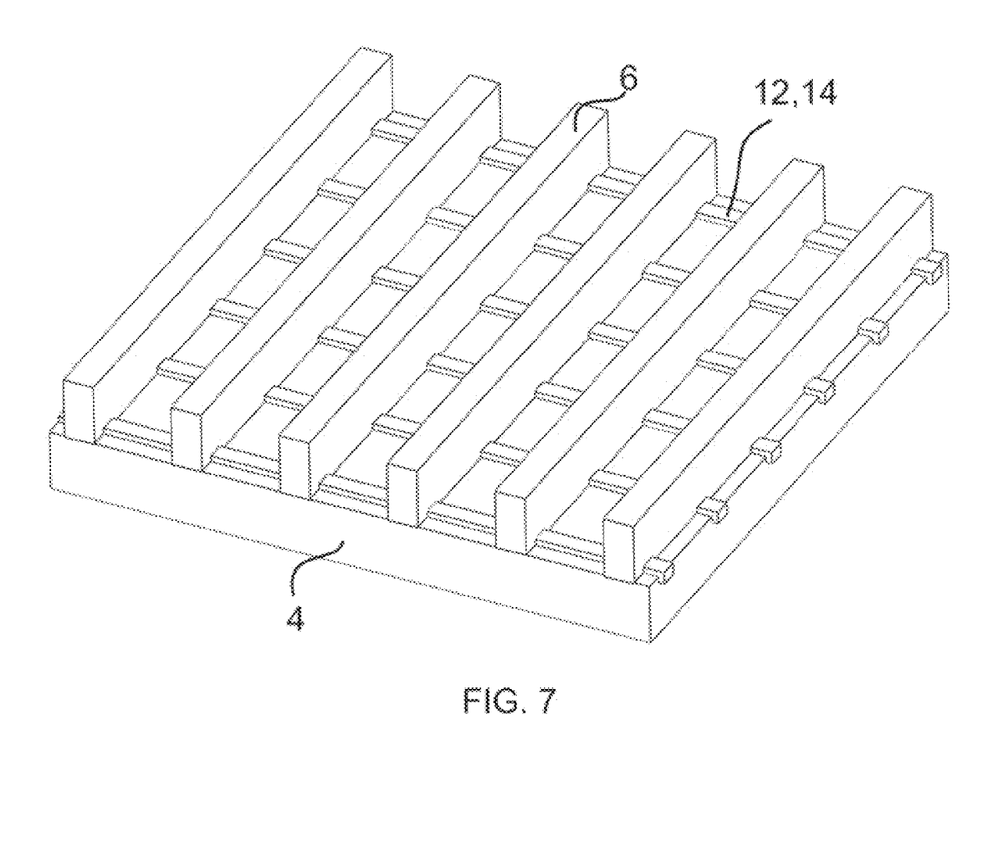
FIG. 7 illustrates a perspective view of a microstructured hydrophobic device according to one embodiment. In this embodiment, the microstructured surface includes a series of trenches and electrodes are configured to have a pattern of wires.

FIG. 7 illustrates a perspective view of the microstructured surface 2 in one exemplary embodiment. In this embodiment, the microfeatures 6 are gratings and the spaces 13 are formed as trenches located between adjacent microfeatures 6. The electrodes 12, 14 are illustrated as wires that extend generally transverse with respect to the microfeatures 6. Alternatively, the electrodes 12, 14 may be aligned parallel with the microfeatures 6.

Figure 8A:
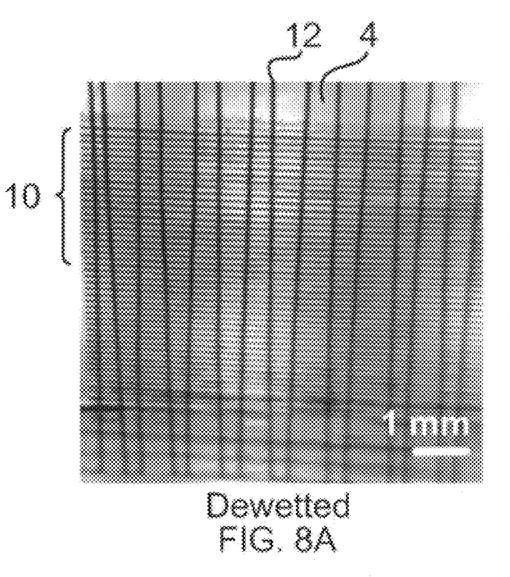
FIG. 8A illustrates the microstructured hydrophobic device with the surface in a dewetted state.
Figure 8B:
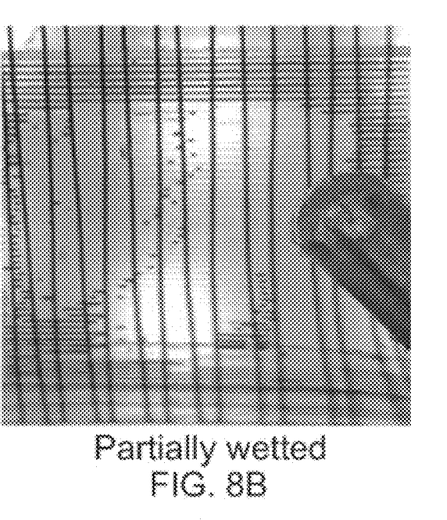
FIG. 8B illustrates the microstructured hydrophobic device with the surface in a partially wetted state.
Figure 8C:
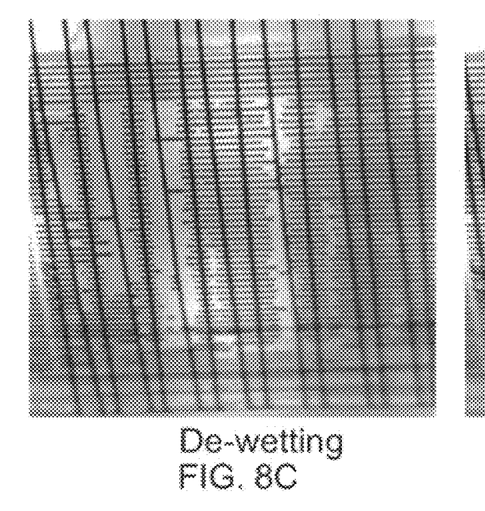
FIG. 8C illustrates the microstructured hydrophobic device with the surface in a de-wetting state where gas is actively created and pushing out the electrolyte.
Figure 8D:
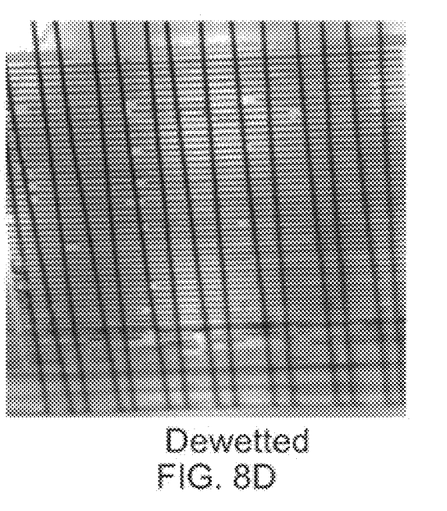
FIG. 8D illustrates the microstructured hydrophobic device with the surface in a de-wetted state resembling that of FIG. 8A.

FIGS. 8A-8D illustrate photographs of experimental results of a microstructured surface 2 operating in the configuration of FIG. 2. While fully submerged in water (i.e., seawater), the FIG. 8A image show the spaces 13 between microfeatures 6 filled with gas (shown as black or dark lines perpendicular to the microfeatures 6. In the state of FIG. 8A, the microstructured surface 2 is in a dewetted state. FIG. 8B shows a substantial portion of the spaces 13 between microfeatures 6 filled with water (i.e., much of the microstructured surface 2 in a wetted state). In the state of FIG. 8B, the microstructured surface 2 is in a partially wetted state. FIG. 8C illustrates the water in the spaces being replaced by the gas 10 generated within the spaces 13 (i.e., the microstructured surface 2 being dewetted). FIG. 8C thus illustrates the de-wetting state whereby gas 10 is used to push our or expel the water contained in the spaces 13. FIG. 8D shows that nearly all the water in the spaces 13 is replaced by the gas 10, i.e., the microstructured surface 2 has returned to a dewetted state. The surface was not connected to any power source during the experiment. The gas in the microfeatures was maintained in a self-regulated and self-powered fashion.

The microstructured surfaces 2 described herein may be used on an exterior surface of a water-borne vehicle or watercraft (e.g., boat, ship, or the like) that comes into contact with the water. In one particular embodiment, the choice of materials for electrodes 12, 14 is selected for particularly suitability for use in salt-water contact applications (e.g., for water-borne vehicles or watercraft that travel in seawater). The microstructured surfaces 2 may also be used in other applications. For example, the microstructured surfaces 2 may be located on the inner surface of a pipe or conduit.

While embodiments have been shown and described, various modifications may be made without departing from the scope of the inventive concepts disclosed herein. The invention(s), therefore, should not be limited, except to the following claims, and their equivalents.

What is claimed is:

1. A method of forming a microstructured surface comprising:
   depositing electrodes on a surface of a substrate;
   securing a mold in tight contact against a surface of the electrodes, the mold containing a plurality of cavities therein and wherein the electrodes do not substantially block the plurality of cavities;
   applying pressure between the mold and the substrate to force material from the substrate around or through the electrodes into the plurality of cavities to form a plurality of microfeatures while the tight contact between the mold and the surface of the electrodes prevents the material from the substrate from covering the electrodes that is in the tight contact with the mold; and
   separating the mold from the substrate wherein the surface of the electrodes in tight contact with the mold are exposed in between microfeatures with little or no material from the substrate present.

2. The method of claim 1, wherein the pressure is applied at an elevated temperature.

3. The method of claim 1, further comprising removing any substrate material covering the electrodes after separating the mold from the substrate.

4. The method of claim 1, further comprising coating the plurality of microfeatures with a hydrophobic layer.

5. The method of claim 4, wherein the hydrophobic layer comprises polytetrafluoroethylene (PTFE).

6. The method of claim 1, further comprising connecting the electrodes on the substrate to another electrode formed from a different material.

7. The method of claim 1, wherein the substrate comprises a polymer.

8. The method of claim 1, wherein the substrate comprises polytetrafluoroethylene (PTFE).

9. The method of claim 1, wherein the substrate comprises multiple layers of different materials and wherein the microfeatures are formed of a material different from the substrate.

10. The method of claim 1, wherein the plurality of microfeatures have a height within a range of single microns to tens of microns.

11. The method of claim 1, wherein an opening dimension of the plurality of cavities is larger than a width dimension of the electrodes.

12. The method of claim 1, wherein the electrodes comprise a porous layer, mesh, or a collection of wires.

13. The method of claim 1, wherein the electrodes comprise a first electrode and second electrode, wherein the first electrode and the second electrode have different standard electrode potentials (SEP).

* * * * *